United States Patent [19]
Barrow

[11] Patent Number: 6,087,876
[45] Date of Patent: Jul. 11, 2000

[54] TIME DELAY GENERATOR AND METHOD

[75] Inventor: Jeffrey G. Barrow, Longmont, Colo.

[73] Assignee: Analog Devices, Inc., Norwood, Mass.

[21] Appl. No.: 09/229,827

[22] Filed: Jan. 13, 1999

[51] Int. Cl.[7] .................................................. H03H 11/26
[52] U.S. Cl. .......................... 327/281; 327/280; 327/276; 327/270
[58] Field of Search .................................. 327/281, 270, 327/280, 276, 393, 131, 132

[56] References Cited

U.S. PATENT DOCUMENTS

| | | | |
|---|---|---|---|
| 4,434,403 | 2/1984 | Chang ...................................... | 327/276 |
| 4,742,331 | 5/1988 | Barrow et al. ...................... | 340/347 R |
| 4,899,152 | 2/1990 | Barrow et al. ........................... | 341/154 |
| 5,192,922 | 3/1993 | Jordan ...................................... | 332/109 |
| 5,198,785 | 3/1993 | Jordan ...................................... | 332/109 |

FOREIGN PATENT DOCUMENTS

| | | | |
|---|---|---|---|
| 404048813A | 2/1992 | Japan ...................................... | 327/280 |

*Primary Examiner*—Dinh T. Le
*Attorney, Agent, or Firm*—Koppel & Jacobs

[57] ABSTRACT

A time delay generator (20) includes a threshold generator (30), a ramp generator (32) and a comparator (34). The threshold generator provides a fixed threshold at one input of the comparator while the ramp generator provides at the other input a ramp signal whose slope is programmable. The ramp generator includes current switches (86 and 90) and a current converter (74). In response to input and range signals, the current switches provide a programmed input current and a programmed range current. The current converter generates a ramp current that is proportional to the range current and inversely proportional to the input current and couples that ramp current to an integrating ramp capacitor. The structure of the time delay generator facilitates noise filtering of the threshold signal and positioning of the threshold signal away from ramp nonlinearities.

9 Claims, 2 Drawing Sheets

TIME DELAY GENERATOR AND METHOD

BACKGROUND OF THE INVENTION

1. Field of the Invention

The present invention relates generally to electronic timing circuits and more particularly to time delay generators.

2. Description of the Related Art

Programmable time delays are useful in a variety of electronic circuits, e.g., pulse generators, timing circuits, multiple-phase clock generators, high-speed logic testers and waveform generators. Circuits for generating programmable time delays have included tapped delay lines, high-speed counters and ramp comparators. Although delay line circuits can produce precision time delays, they typically lack resolution, are expensive and exhibit high power dissipation. High-speed counters have been combined and arranged in various time delay circuits but they generally are not practical for generating subnanosecond delays. In contrast, ramp comparators provide a flexible, low cost approach to generation of a wide range of precise time delays. In addition, they generally can be realized as monolithic integrated circuits.

Ramp comparators typically include a comparator whose output signal is responsive to the difference between a threshold signal and a ramp signal. In a first class of ramp comparators, a fixed-slope ramp signal is generated by a ramp generator and a threshold generator generates a threshold signal whose level is responsive to an input signal, e.g., a digital word. In a second class of ramp comparators, a fixed threshold signal is generated by a threshold generator and a ramp generator generates a ramp signal whose slope is responsive to an input signal.

A common problem in ramp comparators is that programmed time delays are sensitive to operational parameter changes, e.g., changes in temperature and changes in supply voltages. This sensitivity was addressed in U.S. Pat. Nos. 4,742,331 and 4,899,152 to Barrow, Jeffrey G., et al., which respectively issued May 3, 1988 and Feb. 6, 1990 and were assigned to Analog Devices, Inc., the assignee of the present invention.

These Patents are directed to ramp comparators of the first class and use programmable digital-to-analog converters (DACs) to generate a programmable threshold signal. Preferably the DACs are switched-current DACs in which reference currents are selectively steered to a summer, e.g., an operational amplifier. Because their reference currents are switched but not interrupted, the operating speed of these DACs is enhanced.

In U.S. Pat. Nos. 4,742,331 and 4,899,152, a fixed current charges a capacitor to generate a ramp signal and also flows across a ramp reference resistor to generate a ramp reference voltage that is proportional to the ramp slope. The total current of the DACs flows through a threshold reference resistor to generate a threshold reference voltage that is proportional to the threshold voltage. A voltage coupler arranges a pair of cross-coupled transistors to couple the ramp reference resistor and the threshold reference resistor so that the ramp and threshold reference voltages are held substantially equal.

Variations in the ramp signal and the threshold signal that are caused by operational parameter changes are therefore forced to track each other, i.e., these variations are converted to common mode signals. The effect of the operational parameter changes on a programmed time delay is reduced because the summer substantially ignores common mode signals.

Although the voltage coupler reduces the sensitivity of programmed time delays to operational parameter changes, ramp comparators of the first class are typically sensitive to the presence of noise at the comparator inputs. Noise signals which are picked up on the ramp signal are inherently filtered by the integration of the ramp capacitor. In contrast, filtering elements (e.g., a shunt capacitor) cannot be added to the programmed threshold signal without degrading the time response of the ramp comparator.

Various circuit imperfections, e.g., stray capacitances and limited speed of transistor switches, typically cause a ramp signal to have degraded linearity in the region of the ramp start. Preferably, threshold signals are spaced away from this region to avoid degradation of the programmed time delays. However, in ramp comparators of the first class this requires limiting the threshold signal selection range and, therefore, the range of programmable time delays.

SUMMARY OF THE INVENTION

The present invention is directed to a programmable time delay generator which has reduced sensitivity to noise signals and to ramp nonlinearities. This goal is achieved with a time delay generator which compares a fixed threshold signal with a ramp signal whose slope is responsive to an input signal and a range signal.

In particular, the time delay generator generates an input current and a range current whose amplitudes are respectively responsive to an input signal and a range signal, forms a ramp current which is proportional to the range current and inversely proportional to the input current, integrates the ramp current to form a ramp signal, and compares the ramp signal to a fixed threshold signal to produce an output signal after a time delay which is a function of the input signal and the range signal. The range signal can be programmed to increase the range and the resolution of time delays that are selected with the input signal.

In one embodiment, the ramp generator includes an input current generator which generates an input current whose amplitude is responsive to an input signal, a range current generator which generates a range current whose amplitude is responsive to a range signal and a current converter which is configured to generate a ramp current that is proportional to the range current and inversely proportional to the input current. The current generators are preferably formed with high-speed switched-current digital-to-analog converters.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 1:
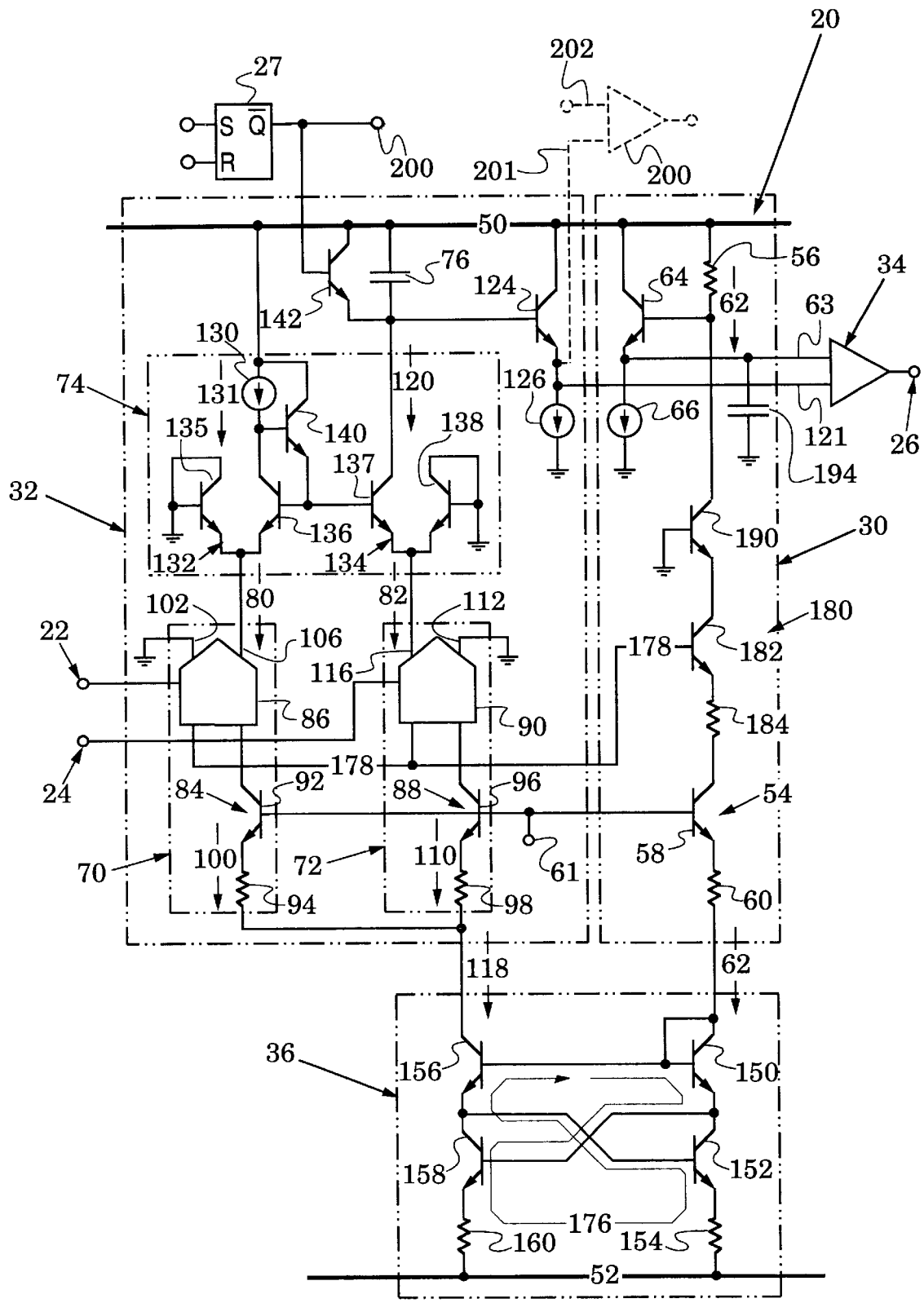
FIG. 1 is a schematic of a programmable time delay generator in accordance with the present invention.

FIG. 1 is a schematic of a programmable time delay generator 20 in accordance with the present invention. In response to an input digital word at an input port 22 and a range digital word at a range port 24, the generator 20 generates a programmable time delay to a state change at an output port 26. The time delay is proportional to the input digital word and inversely proportional to the range digital word.

The time delay generator 20 includes a threshold generator 30, a ramp generator 32, a comparator 34 and a voltage coupler 36. The threshold generator 30 establishes a threshold signal at one input of the comparator 34 and the ramp generator 32 establishes ramp signals at another comparator input whose slopes are programmed with the input and ramp digital words. In particular, the ramp digital word can select the range and resolution of time delays that are programmed with the input digital word.

A more detailed operational description of the time delay generator 20 is preceded by the following description of the generator's main elements which are biased between a supply voltage rail 50 and a supply voltage rail 52.

The threshold generator 30 includes a threshold current source 54 and a threshold resistor 56 which is connected to the supply voltage 50. The current source 54 is formed by a transistor 58 and an emitter resistor 60. The base of the transistor 58 is coupled to a bias voltage 61. The current source 54 generates a threshold current 62 which is conducted through the threshold resistor 56 to provide a threshold signal. The threshold signal is coupled to an input 63 of the comparator 34 through an emitter follower circuit that is formed by an emitter follower 64 and a current source 66 which are serially coupled between the supply voltage 50 and ground.

The ramp generator 32 includes a programmable input current generator 70, a programmable range current generator 72, a current converter 74 and a ramp capacitor 76. The programmable input current generator 70 generates an input current 80 whose amplitude is responsive to the value of an input digital word at the input port 22. The programmable range current generator 72 generates a range current 82 whose amplitude is responsive to the value of a range digital word at the range port 24.

In detail, the programmable input current generator 70 includes a current source 84 and a programmable current switch 86. Similarly, the programmable range current generator 70 includes a current source 88 and a current switch 90. Preferably, the current switches 86 and 90 are realized as switched-current digital-to-analog converters. The current sources 84 and 88 are similar to the current source 54. The current source 84 is formed by a transistor 92 and an emitter resistor 94 and the current source 88 is formed by a transistor 96 and an emitter resistor 98. The bases of the transistors 92 and 96 are coupled to the bias voltage 61.

The current source 84 generates a reference current 100. In response to an input digital word at the input port 22, the current switch 86 apportions the reference current 100 between outputs 102 and 106 of the current switch 86. The output 102 is connected to ground and output 106 is coupled to the current converter 74. Thus, an input current 80 at the output 106 can be programmed from the input port 22 to vary between a minimum of zero and a maximum which equals the reference current 100.

The current source 88 generates another reference current 110. In response to a range digital word at the range port 24, the current switch 90 apportions the reference current 110 between outputs 112 and 116 of the current switch 90. The output 112 is connected to ground and output 116 is coupled to the current converter 74. Thus, a range current 82 at the output 116 can be programmed from the range port 24 to vary between a minimum of zero and a maximum which equals the reference current 110.

In an exemplary set of current switches 86 and 90, an input digital word that is applied at the input port 22 and increased from 00 - - - 0 to 11 - - - 1 causes the input current 80 to increase from zero to a current substantially equal to the reference current 100. Similarly, a range digital word that is applied at the range port 24 and increased from 00 - - - 0 to 11 - - - 1 causes the range current 80 to increase from zero to a current substantially equal to the reference current 110.

The resistors 94 and 98 of the input current generator 70 and the range current generator 72 are connected together so that the reference currents 100 and 110 combine to form a sum current 118 that is coupled into the voltage coupler 36.

The current converter 74 generates a ramp current 120 that is proportional to the range current 82 and inversely proportional to the input current 80. This ramp current 120 is coupled to the ramp capacitor 76 to develop a ramp signal that is coupled to an input 121 of the comparator 34 through an emitter follower circuit which is made up of an emitter follower 124 and a current source 126. The ramp capacitor 76 and the emitter follower 124 are connected to the supply voltage 50.

The current converter 74 includes a current source 130, a first differential pair 132 of transistors 135 and 136 and a second differential pair 134 of transistors 137 and 138. The current source 130 develops a reference current 131. The transistors 135 and 136 are arranged with their emitters coupled to conduct the input current 80 from the current switch 86, with the collector and base of transistor 135 coupled to ground and with the collector of transistor 136 coupled to the current source 130 to receive the reference current 131.

The transistors 137 and 138 are arranged with their emitters coupled to conduct the range current 82 from the current switch 90, with the collector and base of transistor 138 coupled to ground and with the collector of transistor 137 coupled to the ramp capacitor 76. Finally, the bases of transistors 136 and 137 are coupled together.

A transistor 140 is arranged with its emitter and base respectively connected to the base and collector of transistor 136 and with its collector connected to the supply voltage 50. The transistor 140 clamps the collector of transistor 136 to insure an adequate voltage drop across the current source 130.

The ramp generator 32 also includes a transistor 142 which is arranged with its collector and emitter across the ramp capacitor 76 and with its base connected to the flip-flop 27 so that a trigger signal on the reset port of the flip-flop 27 biases the transistor 142 into an on state. In this state, the ramp capacitor 76 is discharged and the ramp current 120 is conducted through the transistor 142. A trigger pulse on the set port of the flip-flop 27 biases the transistor 142 into an off state. The ramp current 120 is then allowed to flow out of the ramp capacitor 76. Thus, a trigger pulse at the flip-flop 27 starts a programmed time delay by initiating the generation of a ramp signal across the capacitor 76.

The voltage coupler 36 includes a diode 150 (in this embodiment, the diode 150 is realized with a transistor structure), a transistor 152 and a threshold reference resistor 154 which are arranged in series and a transistor 156, transistor 158 and a ramp reference resistor 160 which are also arranged in series. The resistors 154 and 160 are connected to the supply voltage 52.

The transistors 152 and 158 form a cross-coupled pair, i.e., the base of each is coupled to the collector of the other. The base of transistor 156 is connected to the upper side of the diode 150. The voltage coupler 36 is arranged so that the diode 150 receives the threshold current 62 from the threshold generator 30 and the transistor 156 receives the sum current 118 from the ramp generator 32. The cross-coupled transistor 152 couples the threshold current 62 to the threshold reference resistor 154 and the cross-coupled transistor 158 couples the sum current 118 to the ramp reference resistor 160.

An operational description of the time delay generator 20 is enhanced by preceding it with an operational description of the current converter 74. Accordingly, the current converter 74 is redrawn in FIG. 2 with the collector currents of transistors 135 and 138 respectively labeled as currents 160 and 162.

Because the bases of transistors 135 and 138 are connected to the same ground potential, the base-emitter voltages $V_{be}$ of the differential pairs 132 and 134 have a relationship of $$-V_{be135}+V_{be136}-V_{be137}+V_{be138}=0 \qquad (1)$$

The collector current $i_c$ of a transistor is related to its base-emitter voltage $V_{be}$ as $$V_{be} = \frac{k_B T}{q}\ln(i_c) \qquad (2)$$

in which $k_B$ is Boltzman's constant, T is absolute temperature in degrees Kelvin and q is electronic charge. With use of relationship (2), equation (1) can be rearranged as $$\frac{kT}{q}\ln\frac{i_{131}i_{162}}{i_{160}i_{120}} = 0 \qquad (3)$$

in which the subscripts 120, 131, 160 and 162 refer respectively to the ramp current 120, the reference current 131, the collector current 160 and the collector current 162. Equation (3) infers that the argument of the natural logarithm equals one so that $$i_{131}i_{162}=i_{160}i_{120}. \qquad (4)$$

Figure 2:
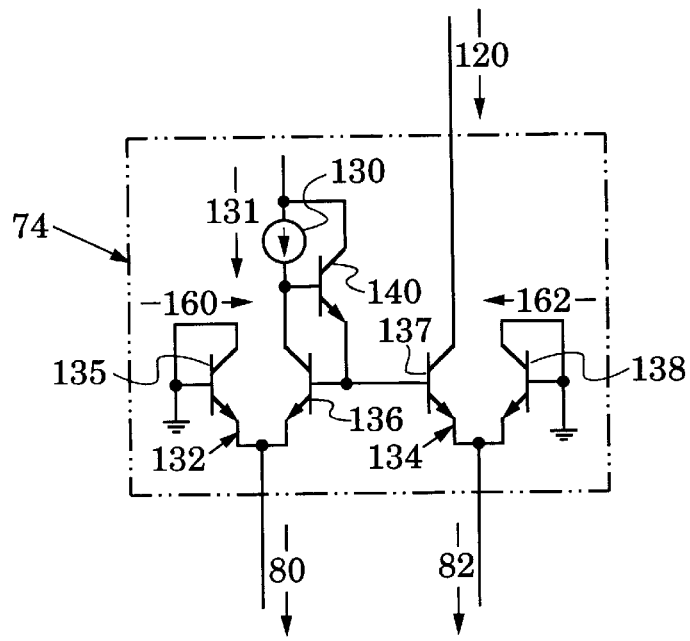
FIG. 2 is a schematic of a current converter in the time delay generator of FIG. 1.

From FIG. 2 it is apparent that $i_{160}+i_{131} \approx i_{80}$ and that $i_{120}+i_{162} \approx i_{82}$. With substitution of these relationships and rearrangement, equation (4) becomes $$i_{120} = i_{131}\frac{i_{82}}{i_{80}}. \qquad (5)$$

Therefore, the current converter 74 of FIG. 1 generates a ramp current 120 which equals the reference current 131 times the range current 82 divided by the input current 80. That is, the current converter 74 generates a ramp current 120 which is proportional to the range current 82 and which is inversely proportional to the input current 80.

From FIG. 1, it is apparent that the change of voltage $\Delta v$ across the ramp capacitor 76 with change in time $\Delta t$ is related to the ramp current 120 by $$i_{120} = C\frac{\Delta v}{\Delta t}. \qquad (6)$$

Combining equations (5) and (6) yields $$\frac{\Delta v}{\Delta t} = \left(\frac{i_{131}}{C}\right)\frac{i_{82}}{i_{80}} \qquad (7)$$

for the slope of the ramp signal across the ramp capacitor 76 and $$\Delta t = \left(\frac{C\Delta v}{i_{131}}\right)\frac{i_{80}}{i_{82}} \qquad (8)$$

for the time to achieve a given voltage excursion $\Delta v$ across the ramp capacitor 76.

When the transistor 142 is on, an initial voltage $V_i$ will be coupled by the emitter follower 124 to the input 121 of the comparator 34. The emitter follower 64 will couple to the input 63 of the comparator 34 a threshold voltage $V_t$, which is generated by the threshold current 62 flowing across the threshold resistor 56. The specific difference $V_A$ between these voltages represents the ramp voltage excursion that is necessary (after the transistor 142 is turned off) to change the output state of the comparator 34. The specific difference $V_A$ can be substituted for the general difference $\Delta v$ in equation (8) to describe programmable time delays $\Delta T_{pr}$ of the time delay generator 20 as $$\Delta T_{pr} = \left(\frac{CV_A}{i_{131}}\right)\frac{i_{80}}{i_{82}} = K\frac{i_{80}}{i_{82}} \qquad (9)$$

in which K is a constant equal to $CV_A/i_{131}$.

Figure 3:
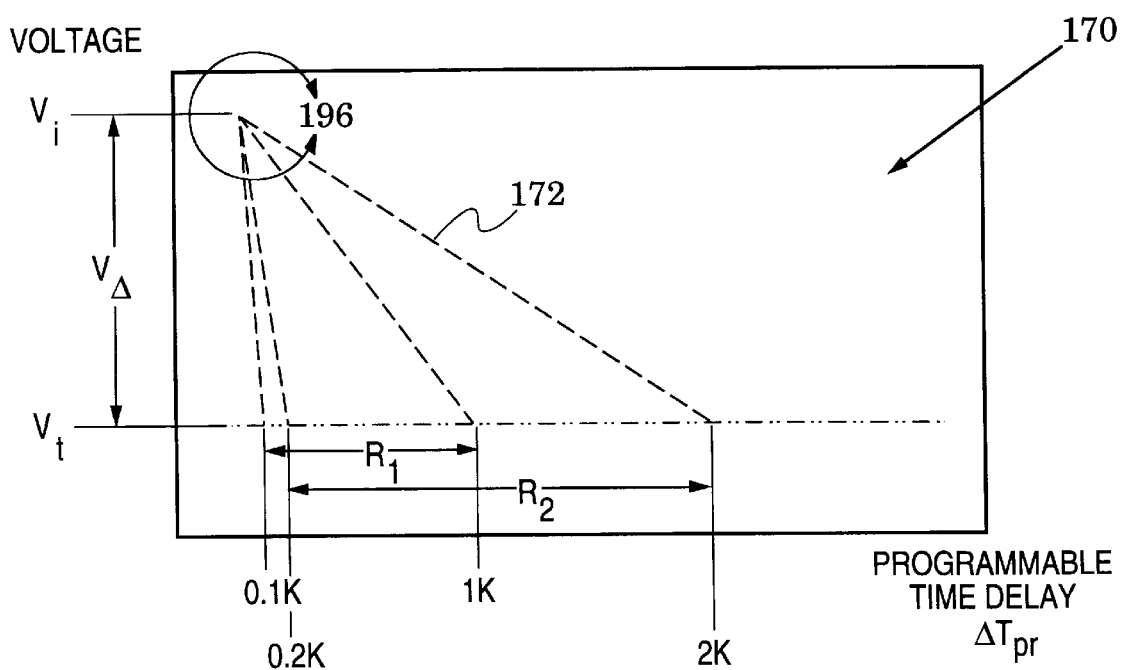
FIG. 3 is a graph of exemplary time delay ranges in the programmable time delay generator of FIG. 1.

The graph 170 of FIG. 3 shows the initial voltage $V_i$, the threshold voltage $V_t$ and the difference $V_A$ and illustrates equation (9) for exemplary values of the input current 80 and the ramp current 82. For descriptive purposes, it is assumed that the input current generator 70 and the range current generator 72 can be programmed to respectively vary the input current 80 and the range current 82 from 1 milliamp to 10 milliamps.

If the range current 82 of FIG. 1 is initially set to 10 milliamps by an appropriate digital word at the range port 24, then the programmable time delay $\Delta T_{pr}$ will vary over a first time range $R_1$ of 0.1K to 1K seconds as the input current 80 is caused to vary over its range by application of appropriate digital words at the input port 22. If the range current 82 is next set to 5 milliamps by an appropriate digital word at the range port 24, then the programmable time delay $\Delta T_{pr}$ will vary over a second time range $R_2$ of 0.2K to 2K seconds as the input current 80 is caused to vary over its range by application of appropriate digital words at the input port 22.

The time ranges $R_1$ and $R_2$ are shown in FIG. 3 and broken lines 172 illustrate changing ramp voltage (at the comparator input 121 in FIG. 1) during programmable time delays $\Delta T_{pr}$ at the extremes of the time ranges. Although it is not illustrated in FIG. 3, if the range current were programmed to 1 milliamp, the programmable time delay $\Delta T_{pr}$ could be varied over a time range of 1K to 10K seconds as the input current 80 is caused to vary over its range by application of appropriate digital words at the input port 22.

In the programmable time delay generator 20 of FIG. 1, the value of a range signal at the range port 24 can therefore be increased to select increasingly broader ranges over which programmable time delays $\Delta T_{pr}$ can be selected with an input signal at the input port 22. As the range width is increased, the time delay resolution associated with the input port 22 is decreased.

The sensitivity of the time delay generator 20 to operational parameter changes (e.g., changes in temperature and changes in supply voltages) is decreased by the voltage coupler 36. This is shown by summing voltage drops around the closed loop 176 in FIG. 1 to obtain $$V_{be150}+V_{be158}+I_{118}R_{160}-I_{62}R_{154}-V_{be152}-V_{be156}=0 \quad (10)$$

Transistors 150 and 152 conduct the threshold current 62 so that their base-emitter voltages $V_{be150}$ and $V_{be152}$ are substantially equal. Similarly, transistors 158 and 156 conduct the sum current 118 so that their base-emitter voltages $V_{be158}$ and $V_{be156}$ are substantially equal. When these elements are canceled, equation (10) becomes $$I_{118}R_{160}=I_{62}R_{154} \quad (10)$$

which shows that the voltage coupler 36 causes the voltages across the ramp reference resistor 160 and the threshold reference resistor 154 to track each other. Because the ramp current 120 is proportional to the sum current 118, equation (10) illustrates that variations in the ramp current and the threshold current which result from operational parameter changes are converted to common mode signals at the input to the comparator 34. Typical comparators (e.g., operational amplifiers) have excellent common mode rejection and, accordingly, the effect of operational parameter changes on the programmable time delay generator 20 are reduced by the voltage coupler 36. The voltage coupler 36 is similar to one described above in the description of related art with reference to U.S. Pat. Nos. 4,742,331 and 4,899,152.

The effect of operational parameter changes on the programmable time delay generator 20 of FIG. 1 is further reduced by having the current source 54 of the threshold generator 30 and the current sources 84 and 88 of the ramp generator 32 biased from a common bias voltage 61. This also converts current variations to common mode signals which are substantially ignored by the comparator 34.

The amplitudes of switched currents in typical current switches (e.g., switched-current digital-to-analog converters) are set by precision current sources which are referenced to a common bias voltage. This bias voltage exits the input current generator 86 and the range current generator 90 on the line 178 in FIG. 1. This bias voltage is used to bias an emitter follower 180 which conducts the threshold current 62. The emitter follower 180 is formed by a transistor 182 and an emitter resistor 184. Thus, the effect of operational parameter changes on the programmable time delay generator 20 is further reduced by reflecting any changes in the currents within the input current generator 86 and the range current generator 90 to the threshold current 62 that flows through the emitter follower 180.

Transistor 190 is also inserted into the threshold generator 30 to carry the threshold current 62. This transistor's base is coupled to ground as are also the bases of the differential pairs 132 and 134 of the current converter 74. Thus, the voltages across the current switches 86 and 90 and the transistor 182 are substantially equal and the voltages across transistors 92, 96 and 58 are also substantially equal. This tends to equalize the effect of operational parameter changes on transistor parameters, e.g., the Early voltage, in these elements. Consequently, the effect of operational parameter changes on programmed time delays is further reduced.

In the programmable time delay generator 20 of FIG. 1, the start of each programmed time delay can be indicated by a signal, e.g., the output 200, that is associated with the flip-flop 27. Alternatively, the time delay start can be indicated by a comparator 200 which has one input 201 coupled to the threshold signal (e.g., at the input 121 of the comparator 34) and another input 202 coupled to an offset signal which is slightly offset from the initial ramp voltage ($V_i$ in FIG. 3).

Noise sensitivity of the programmable time delay generator 20 of FIG. 1 can be reduced by adding filtering elements, e.g., the shunt capacitor 194 at the comparator input 63. This filtering is facilitated by the structure of the generator 20. Because the threshold signal is fixed, the threshold generator output can be filtered without degrading other performance parameters of the generator. In contrast, similar filtering cannot be added to delay generators in which the threshold voltage is programmed without degrading the generators response time.

Circuit imperfections (e.g., stray capacitances and limited switching speed of transistors such as the transistor 142) typically cause ramp generators to generate nonlinearities at the start of the ramp, e.g., in the start area circled by the line 196 in FIG. 3. Degradation effects of these nonlinearities are reduced in the programmable time delay generator 20 because the threshold voltage can be positioned far from the ramp start. In delay generators in which the threshold voltage is programmed, this is not easily accomplished because the threshold voltage is preferably programmed over a wide range.

Although the transistors of FIGS. 1 and 2 are exemplified as bipolar transistors, other time delay generator embodiments can be formed with other transistor types. In general, the teachings of the invention can be practiced with any transistors that have first and second current terminals which are responsive to a control terminal. Although the current switches 86 and 90 are preferably realized as high-speed switched-current digital-to-analog converters, they can be in general any current generator whose output current is responsive to an input signal, e.g., a digital word. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A programmable time delay generator, comprising;
   a threshold generator configured to generate a threshold signal;
   a ramp generator having;
   a) an input current generator which generates an input current having an amplitude responsive to an input signal;
   b) a range current generator which generates a range current having an amplitude responsive to a range signal;
   c) a current converter which is configured to generate a ramp current that is proportional to said range current and inversely proportional to said input current; and
   d) a capacitor coupled to receive said ramp current and generate a ramp signal; and
   a comparator which generates a time delay output in response to the difference between said threshold signal and said ramp signal, said time delay output thus being a function of said input signal and said range signal.

2. The programmable time delay generator of claim 1, wherein said current converter includes:
   a reference current source which generates a reference current;
   a first differential pair of transistors that each have first and second current terminals and a control terminal, said first differential pair arranged with said second current terminals coupled to receive said input current, with the first current terminal and said control terminal of one of said first differential pair coupled to a common voltage potential and with the first current terminal of the other of said first differential pair coupled to receive said reference current; and a second differential pair of transistors that each have first and second current terminals and a control terminal, said second differential pair arranged with said second current terminals of said second differential pair coupled to receive said range current, with the first current terminal and said control terminal of one of said second differential pair coupled to said common voltage potential, with the control terminal of the other of said second differential pair coupled to the control terminal of the other of said first differential pair and with the first current terminal of the other of said second differential pair coupled to said capacitor, said current converter generating said ramp current in the first current terminal of the other of said second differential pair in response to said reference current, said input current and said range current.

3. The programmable time delay generator of claim 2, wherein said input current generator and said range current generator are switched-current digital-to-analog converters.

4. The programmable time delay generator of claim 1, wherein said threshold generator includes:

a threshold current generator which generates a threshold current; and a resistor coupled to said current generator to conduct said threshold current.

5. The programmable time delay generator of claim 4, further including a voltage couple coupled to said current generator and said range current generator, said voltage coupler comprising:

a threshold reference resistor arranged to conduct at least a portion of said threshold current to generate a threshold reference voltage;

a ramp reference resistor arranged to conduct at least a portion of said ramp current to generate a ramp reference voltage; and said coupler configured to maintain said threshold reference voltage and said ramp reference voltage in a substantially equal relationship.

6. The programmable time delay generator of claim 5, wherein said voltage coupler further includes:

a diode coupled to said current generator;

a ramp transistor having first and second current terminals and a control terminal, said first and second current terminals of said ramp transistor arranged to conduct said ramp current portion; and first and second cross-coupled transistors each having first and second current terminals and a control terminal wherein the control terminal of each of said first and second cross-coupled transistors is coupled to the first current terminal of the other of said first and second cross-coupled transistors;

wherein;

one of said first and second cross-coupled transistors is positioned to couple said ramp transistor and said ramp reference resistor with said first and second current terminals of said one transistor and the other of said first and second cross-coupled transistors is positioned to couple one electrode of said diode and said threshold reference resistor with said first and second current terminals of said other transistor; and the control terminal of said ramp transistor is coupled to another electrode of said diode.

7. A method of programming a time delay, comprising the steps of;

generating an input current in response to an input signal;

generating a range current in response to a range signal;

forming a ramp current which is proportional to said range current and inversely proportional to said input current;

integrating said ramp current to form a ramp signal;

providing a threshold signal; and comparing said ramp signal and said threshold signal to produce an output signal after a time delay which is a function of said input signal and said range signal.

8. The method of claim 7, wherein said providing step includes the steps of:

generating a threshold current; and conducting said threshold current across a threshold resistor to produce said threshold signal.

9. The method of claim 8, further including the steps of:

conducting at least a portion of said ramp current across a ramp reference resistor to form a ramp reference voltage;

conducting at least a portion of said threshold current across a threshold reference resistor to form a threshold reference voltage; and maintaining said ramp reference voltage and said threshold reference voltage in a substantially equal relationship.

* * * * *